(12) United States Patent
Higgins, III

(10) Patent No.: US 10,037,965 B2
(45) Date of Patent: Jul. 31, 2018

(54) SEMICONDUCTOR DEVICE HAVING A PROTECTIVE MATERIAL WITH A FIRST PH FORMED AROUND COOPER WIRE BONDS AND ALUMINUM PADS FOR NEUTRALIZES A SECOND PH OF AN OUTER ENCAPSULANT MATERIAL

(71) Applicant: FREESCALE SEMICONDUCTOR, INC., Austin, TX (US)

(72) Inventor: Leo M. Higgins, III, Austin, TX (US)

(73) Assignee: NXP USA, Inc., Austin, TX (US)

( * ) Notice: Subject to any disclaimer, the term of this patent is extended or adjusted under 35 U.S.C. 154(b) by 29 days.

(21) Appl. No.: 15/298,743

(22) Filed: Oct. 20, 2016

(65) Prior Publication Data

US 2017/0040282 A1    Feb. 9, 2017

Related U.S. Application Data

(62) Division of application No. 13/096,102, filed on Apr. 28, 2011, now Pat. No. 9,508,622.

(51) Int. Cl.
*H01L 23/29* (2006.01)
*H01L 23/00* (2006.01)
(Continued)

(52) U.S. Cl.
CPC .............. *H01L 24/49* (2013.01); *H01L 21/56* (2013.01); *H01L 23/295* (2013.01); *H01L 23/3135* (2013.01); *H01L 23/3192* (2013.01); *H01L 23/562* (2013.01); *H01L 24/05* (2013.01); *H01L 24/85* (2013.01); *H01L 24/45* (2013.01); *H01L 24/48* (2013.01); *H01L 2224/02166* (2013.01); *H01L 2224/04042* (2013.01); *H01L 2224/05124* (2013.01); *H01L 2224/05553* (2013.01); *H01L 2224/05567* (2013.01); *H01L 2224/05624* (2013.01); *H01L 2224/45015* (2013.01); *H01L 2224/45124* (2013.01); *H01L 2224/45144* (2013.01); *H01L 2224/45147* (2013.01); *H01L 2224/48463* (2013.01); *H01L 2224/48507* (2013.01); *H01L 2224/48599* (2013.01);
(Continued)

(58) Field of Classification Search
CPC . H01L 23/295; H01L 23/3135; H01L 23/564; H01L 24/05; H01L 24/08; H01L 24/49
See application file for complete search history.

(56) References Cited

U.S. PATENT DOCUMENTS

| | | | | |
|---|---|---|---|---|
| 4,939,014 A | * | 7/1990 | Anderson | C09D 183/04 257/E23.119 |
| 5,258,650 A | * | 11/1993 | Polak | H01L 21/56 174/257 |

(Continued)

*Primary Examiner* — Anh D Mai

(57) ABSTRACT

A semiconductor device includes a plurality of wire bonds formed on a surface of the semiconductor device by bonding each of a plurality of copper wires onto corresponding ones of a plurality of aluminum pads; a protective material is applied around the plurality of wire bonds, the protective material having a first pH; and at least a portion of the semiconductor device and the protective material are encapsulated with an encapsulating material having a second pH, wherein the first pH of the protective material is for neutralizing the second pH of the encapsulating material around the plurality of wire bonds.

17 Claims, 3 Drawing Sheets

(51) Int. Cl.
*H01L 23/31* (2006.01)
*H01L 21/56* (2006.01)

(52) U.S. Cl.
CPC ............... *H01L 2224/48624* (2013.01); *H01L 2224/48799* (2013.01); *H01L 2224/48992* (2013.01); *H01L 2224/49175* (2013.01); *H01L 2224/854* (2013.01); *H01L 2224/8592* (2013.01); *H01L 2224/85205* (2013.01); *H01L 2224/85399* (2013.01); *H01L 2924/00014* (2013.01); *H01L 2924/01001* (2013.01); *H01L 2924/0102* (2013.01); *H01L 2924/01005* (2013.01); *H01L 2924/01006* (2013.01); *H01L 2924/01012* (2013.01); *H01L 2924/01013* (2013.01); *H01L 2924/01014* (2013.01); *H01L 2924/01019* (2013.01); *H01L 2924/01029* (2013.01); *H01L 2924/01033* (2013.01); *H01L 2924/01073* (2013.01); *H01L 2924/01079* (2013.01); *H01L 2924/01082* (2013.01); *H01L 2924/01327* (2013.01); *H01L 2924/0549* (2013.01); *H01L 2924/181* (2013.01); *H01L 2924/186* (2013.01); *H01L 2924/3025* (2013.01)

(56) References Cited

U.S. PATENT DOCUMENTS 5,686,162 A * 11/1997 Polak ..................... H01L 23/293
174/521
2014/0145339 A1 * 5/2014 Chopin .................. H01L 24/48
257/762

* cited by examiner

SEMICONDUCTOR DEVICE HAVING A PROTECTIVE MATERIAL WITH A FIRST PH FORMED AROUND COOPER WIRE BONDS AND ALUMINUM PADS FOR NEUTRALIZES A SECOND PH OF AN OUTER ENCAPSULANT MATERIAL

BACKGROUND

Field

This disclosure relates generally to semiconductor devices, and more specifically, to protecting copper wire bonds in the semiconductor device.

Related Art

As the price of gold has seen a sharp increase in value over the past few years, the cost of producing semiconductors with gold wire bonds has increased proportionally. Semiconductor designers are searching for lower cost materials in order to control costs while maintaining or improving reliability of the semiconductor devices.

Copper is becoming a more popular choice as an interconnection material in semiconductor packaging because the cost of copper is a fraction of the cost of gold. Copper also offers superior electrical and thermal conductivity, develops less intermetallic growth, has greater reliability of the bond at elevated temperatures, and has higher mechanical strength and stability.

Copper wire bonding has not been a popular choice because it is more stressful to a typical aluminum bond pad than gold wire bonding, and the risk of physical damage to aluminum bond pad is greater. This is due to greater hardness of copper versus gold and the need to use more severe wire bonding parameters (e.g. higher force, higher power, higher temperature) for copper wire bonding due to the greater hardness of copper and the slower growth of intermetallic layers versus gold-aluminum intermetallic layers. From the 90 nanometer integrated circuit technology node onward, the back end of line (BEOL) layer stack has been comprised of low dielectric constant (low K) dielectric and copper layers, with a tantalum nitride or tantalum barrier layer between the dielectric and the copper. The bond pad damage risk with copper wire bonding has become more severe with each new IC technology node incorporating increasingly lower dielectric constant interlayer dielectrics (ILD), and copper interconnect. The progressively lower strength of these low K dielectrics and the relatively low adhesion strength between materials comprising the ILD-copper stack are the causes of the increased risk of damage during wire bonding.

The risk of pad damage is also a function of bond pad design features. Increasing the aluminum pad thickness is known to reduce the risk of pad damage, but this can also increase the lateral displacement of aluminum ("aluminum push-out") during the bonding process, risking damage to the passivation layer, or even shorting between very fine pitch bond pads.

BRIEF DESCRIPTION OF THE DRAWINGS

Embodiments of the present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of semiconductor devices and fabrication methods disclosed herein use a protective material over copper wire bonding on aluminum pads. An intermetallic layer is formed when the copper wire is bonded to the aluminum pad. The protective material has a pH that neutralizes contaminants in an encapsulating material that otherwise causes corrosion in the intermetallic layer.

Figure 1:
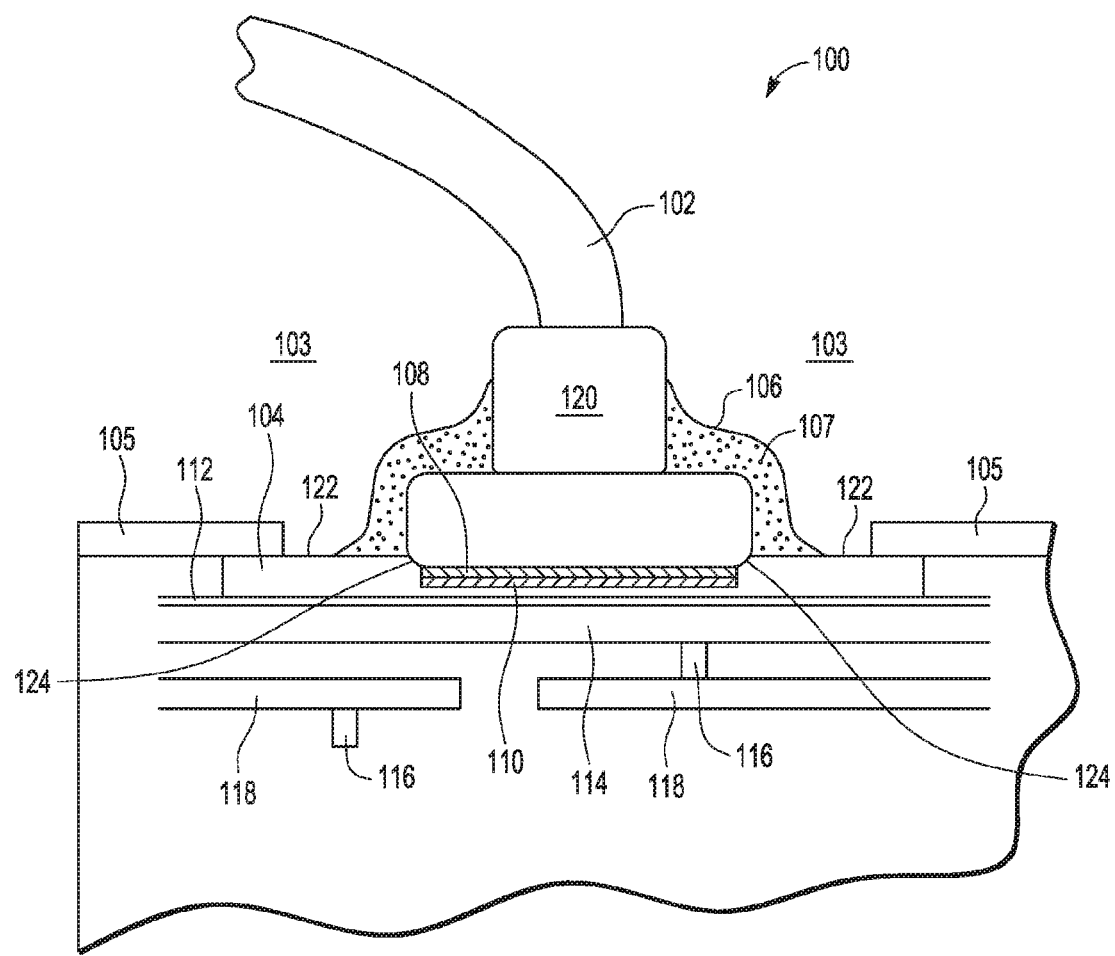
FIG. 1 is a cross-sectional diagram of an embodiment of a semiconductor device in accordance with the present disclosure.

Referring to FIG. 1, a cross-sectional diagram of an embodiment of a semiconductor device 100 in accordance with the present disclosure is shown including copper wire 102, encapsulating material 103, aluminum bond pad 104, passivation material 105, protective material 106, first intermetallic layer 108, second intermetallic layer 110, tantalum layer 112, copper layer 114, one or more vias 116, and interconnect lines 118.

During fabrication, the end of copper wire 102 is heated to a liquid state forming a ball on the end of wire 102 and this end of wire 102 is applied to aluminum pad 104 through an opening in passivation material 105, via a bonding capillary (not shown) thereby forming a ball bond 120 to the aluminum bond pad 104. It is typical to form only sporadic points of intermetallic growth, or no intermetallic growth in regions 124 at the lower edges of ball bond 124 in the vicinity of first intermetallic layer 108 since there can be large displacement of aluminum in this area and the force and ultrasonic energy imparted to the ball bond 120 during bond formation may be poor in region 124.

Passivation material 105 can be made of silicon nitride, silicon oxide, silicon oxynitride, or other suitable material. Copper ball bond 120 adheres to the aluminum pad 104 due to the formation of intermetallic bond layer comprising intermetallic layers 108, 110 at the interface of the flattened copper ball 120 and the aluminum 104. Intermetallic bond layer 108, 110 is typically a bi-layer, with the intermetallic phase 108 in contact with the bottom of ball bond 120 commonly held to have the composition of $Cu_9Al_4$, and the composition of the intermetallic layer 110 in contact with the aluminum pad 104 commonly held to be CuAl or a mixture of CuAl and $CuAl_2$. The intermetallic bond layer 108, 110, and the thickness and continuity of the intermetallic bond layer 108, 110 across the interface between copper ball bond 120 and aluminum pad 104 may vary depending upon the bonding parameters utilized and subsequent thermal processing of the semiconductor device 100. It is known that the structures and compositions of intermetallic bond layer 108, 110 can show further changes with even longer exposure to elevated temperatures or under long term use conditions, especially under conditions where the entire thickness of aluminum pad 104 has been consumed with the formation of intermetallics. Under such conditions the intermetallic stratification may show three layers, or an even more complex structure than shown for the purposes of illustration in FIG. 1. For purposes of description of the present disclosure, the structure of intermetallic bond layer 108, 110 shown in FIG. 1 will be used. The chemical composition of intermetallic layer 108 can be $Cu_9Al_4$, which is copper rich compared to intermetallic layer 110 which has a chemical composition of CuAl, or a mixture of $CuAl_2$ and CuAl.

Tantalum layer 112 forms a barrier between aluminum bond pad 104 and copper layer 114. Vias 116 couple copper layer 114 to interconnect lines 118. Note that semiconductor device 100 can include several additional copper layers 114 and interconnect lines 118, as well as dielectric layers, integrated circuits, and other suitable components.

Semiconductor device 100 can be any type of circuit where a copper wire is bonded to an aluminum pad including a memory device, a microprocessor or other type of microelectronic assembly having integrated circuitry, a single transistor, and/or single diode devices. Copper wire 102 can be exposed on the exterior of semiconductor device 100 for connecting semiconductor device 100 to buses, circuits, semiconductor package substrates, semiconductor package lead frames, and/or other microelectronic assemblies. Semiconductor device 100 is shown having one copper wire 102 and aluminum bond pad 104 providing an external contact, however semiconductor device 100 typically has many more than the one shown. It is not unusual for such semiconductor devices to have hundreds of external contacts.

As integrated circuit transistor feature sizes decrease, demands for higher numbers of contacts continue to increase, resulting in limited amount of space for the contacts. This constantly forces finer wire bond pad pitches, smaller bond pads, and greater bond pad design complexity. The smaller bond pads drive the demand for reduced bond wire diameter, further increasing the difficulty of achieving highly reliable wire bonds due to the continuous reduction of the ball bond-to-die bond area. Reliability of copper wire bonds may also be threatened by corrosion of this reduced bond area.

Protective material 106 is deposited over ball bond 120 at the end of copper wire 102 and flows into an opening in passivation material 105 to enclose exposed portions of copper ball bond 120 and aluminum bond pad 104, including the exposed portions, if present, of intermetallic layers 108 and 110. Protective material 106 fully covers the periphery of ball bond 120 immediately adjacent to where ball bond 120 contacts aluminum pad 104 to prevent corrosion of intermetallic layer 108. Protective material 106 may not fully cover the exposed surface of aluminum pad 104, leaving regions 122 of aluminum pad 104 exposed, or protective material 106 may fully cover the surface of aluminum pad 104 and also cover the edge of the opening in passivation material 105.

Encapsulating material 103 is then deposited over semiconductor device 100 including copper wire 102 and protective material 106. Protective material 106 seals intermetallic bond layer 108, 110 from corrosive substances that may be present in encapsulating material 103.

In some embodiments, protective material 106 is dispensed as soon as possible after copper wire 102 is bonded to aluminum bond pad 104 so heat from the bonding process can be used to help cure protective material 106. For example, protective material 106 is applied to semiconductor device 100 after semiconductor device 100 has been heated to a temperature between 125 and 250 degrees Celsius and copper wire 102 has been bonded to aluminum bond pad 104. Protective material 106 can be further cured by applying thermal energy, microwave energy, infrared energy or ultraviolet energy to semiconductor device 100. It is also possible that protective material 106 may initially contain a liquid or liquids that function as a solvent or carrier for the other constituents of protective material 106. In this instance, curing may involve, in whole, or in part, the evaporation of the liquid or liquids.

In some instances, the material selected for protective material 106 establishes a pH that will neutralize the pH established in encapsulating material 103 in the presence of moisture. For example, protective material 106 can have a pH of greater than about 7.0 when the encapsulating material 103 has a pH of less than about 7.0.

Protective material 106 can comprise filler material 107 suspended in a liquid polymer system that may contain solvent or carrier liquids, which after curing would establish a neutral to mildly alkaline pH in a range of approximately 7-10 in the presence of moisture. Filler material 107 can be a composition of, for example, magnesium hydroxide, aluminum hydroxide, calcium carbonate, magnesium carbonate, and/or calcium hydroxide, or other materials capable of establishing a neutral to mildly alkaline pH within the volume of the protective material 106 in the presence of moisture. Filler material 107 can include particulates with a diameter of between 0.005 to 30.0 microns ($\mu$m), and the types of fillers used can have a surface area in a range of between 0.5 to 500.0 square meters per gram (m2/g), with the high surface area materials containing a high fraction of very fine, or nano-size particles. Filler material 107 can be in range of about 25 to 90 weight percent of the protective material 106. Protective material 106 can have a thickness ranging between 0.005 millimeters (mm) and 0.250 mm, and more specifically, in some embodiments, between 0.010 and 0.100 mm. The liquid polymer can have a low viscosity to assure a desired level of wetting and can have a viscosity in a range of between about 30.0 to 6000.0 milli-Pascal seconds (mPa·s) when measured at shear rates typically used in defining viscosity of dispensable filled liquid polymer systems. Other suitable compositions of filler material 107 and viscosities of uncured protective material 106 can be used. The term "composition" as used herein includes chemical substances as well as finer and coarser particle size distributions, higher and lower weight percent fillers, and higher and lower specific surface areas.

Encapsulating material 103 is generally a plastic or epoxy compound that can be molded to form a casing over the die to seal the die from the external environment and shield the die from electrical and mechanical damage. Conventional techniques for encapsulating die include transfer molding, compression molding, and dispensable systems commonly referred to as glob top encapsulants.

Figure 2:
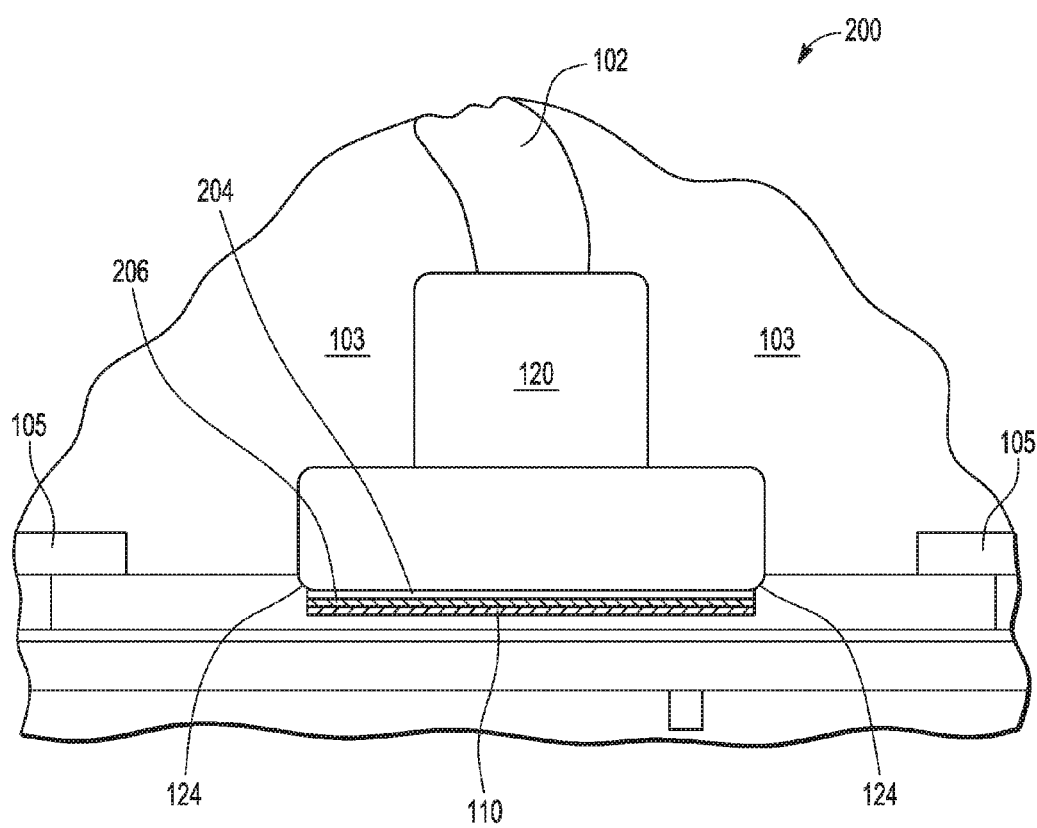
FIG. 2 is a cross-sectional diagram of a conventional wire bond on a semiconductor device.

FIG. 2 is a cross-sectional diagram of a conventional copper wire 102 bonded to aluminum bond pad 104 in a semiconductor device 200 shown to illustrate the problems that may arise when encapsulating material 103 is in contact with intermetallic bond layer 108, 110 shown in FIG. 1. In FIG. 2, encapsulating material 103 may contain various levels of contaminants. To varying degrees, depending upon type of polymer system, type of filler, ratio of filler to polymer system, degree of cure or cross-linking, polymeric encapsulating material 103 will be capable of absorbing and adsorbing water from the ambient environment. The water may dissolve, or react with constituents of encapsulating material 103 freeing species that form cationic and anionic contaminants in the water. The anionic species, including, but not limited to, halogens, sulfur compounds, and organics can readily establish a pH of less than 7 within the volume of encapsulant 103. If the encapsulating material 103 contains a sufficiently high level of contaminants, the pH can become quite acidic, with a pH of less than 5. Once the ionic species are formed in combination with the water, these ionic species become quite mobile and can readily diffuse through the encapsulant 103. Intermetallic bond layer 108, 110 (shown in FIG. 1) may be subjected to the corrosive contaminants in an acidic environment if encapsulating material 103 contains contaminants above a certain level. The problem is exacerbated when voltage is applied to semiconductor device 200. For example, in order to pass a manufacturer's reliability requirements, semiconductor device 200 may be subjected to biased Highly Accelerated Stress Testing (B-HAST) or other tests, such as a Temperature-Humidity-Bias test (THB). B-HAST typically applies higher than nominal voltage to semiconductor device 100 in an ambient environment of 130° C. and 85% relative humidity for 96 hours or more.

In the acidic pH environment intermetallic bond layer 108, 110 is corroded under the action of electrolyte contaminants, thought to be principally anions, including halogen ions. It has been observed that the corrosion occurs principally or exclusively in the copper-rich intermetallic layer 108 in contact with the copper ball bond 120. Under other conditions, it may be possible to corrode an intermetallic layer comprised of less copper-rich intermetallic phases. The corrosion penetrates under the copper ball bond 120 creating a void layer 204 between copper ball bond 120 and an oxidized corrosion product layer 206 on intermetallic layer 110. The copper rich intermetallic layer 108 (shown in FIG. 1) is essentially consumed while the more aluminum rich intermetallic layer 110 remains essentially intact. In FIG. 2 the volume previously occupied by intermetallic 108 (shown in FIG. 1) is replaced by a void layer gap 204 and an underlying corrosion product layer 206 due to the corrosion of the original intermetallic layer 108 (shown in FIG. 1).

One option to prevent or reduce corrosion of intermetallic layers 108 and/or 110 is to determine detailed chemical characteristics of encapsulating material 103 that are less likely to cause corrosion and require suppliers to use materials and processes that will provide the specified chemical characteristics with encapsulating material 103. This option is likely to increase production costs if the supplier has to special order a small quantity of special constituents to make encapsulating material 103, or to alter the percentage of normal constituents of encapsulating material 103 in order to supply small quantities of encapsulating material 103. This is because the supplier typically uses a greater amount of different encapsulating material constituents to make the standard encapsulating material 103 at lower cost due to bulk pricing, and makes larger batches than would be required for a customized version of encapsulating material 103.

As an alternative, protective material 106 protects intermetallic layers 108 and 110 from corrosion and allows a broader selection of standard encapsulating material 103 to be used while lowering cost and level of effort for the manufacturer and the supplier.

Figure 3:
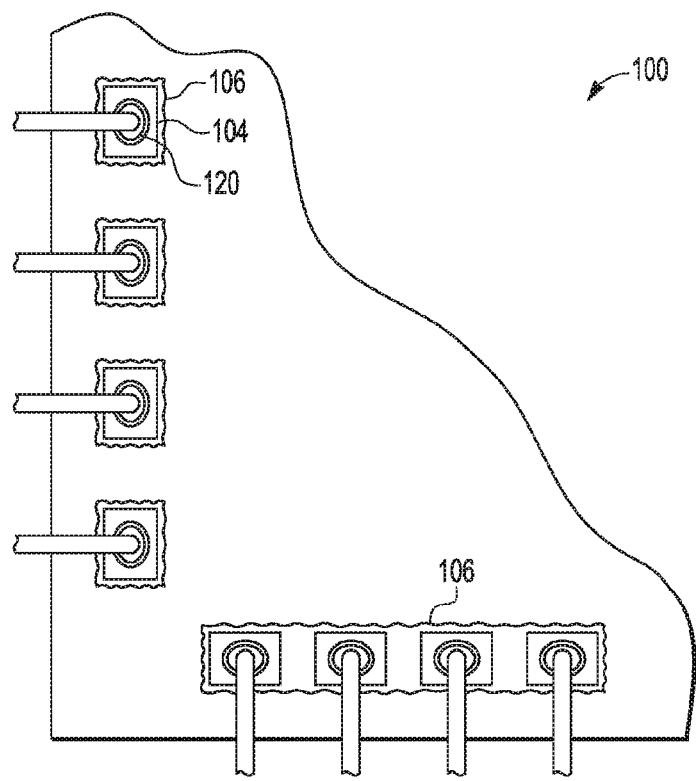
FIG. 3 is a top view of an embodiment of a semiconductor device in accordance with the present disclosure.

FIG. 3 is a top view of a larger section of semiconductor device 100 in accordance with the present disclosure showing a series of ball bonds 120 bonded to aluminum bond pads 104 around the edges of semiconductor device 100. It is understood that while FIG. 3 shows a single row of pads 104, the pads 104 may be disposed at any location across the surface of semiconductor device 100. FIG. 3 shows two options for applying protective material 106. A first option is to dispense protective material 106 over each wire's ball bond region individually, as shown on the left edge of semiconductor device 100. A second option is to dispense a continuous strip of protective material 106 along a row of wire bonds to coat each wire's ball bond region, as shown along the lower edge of semiconductor device 100.

Generally protective material 106 can be dispensed using some form of a needle dispenser. This type of dispenser may use a range of methods involving various types of pumping mechanisms to dispense protective material 106. These mechanisms include constant displacement and Archimedes screw pumps, and jet dispensers that typically use a piezoelectric actuator to dispense tiny, individual droplets of material with high frequency pulses. It is understood that other forms of dispensing, or applying protective material 106, are anticipated. The rheology of protective material 106 may be tailored with modification of the filler material particle size distribution and specific surface area, and possible inclusion of a small quantity of a thixotrope, an extremely fine particle size and very high surface area material, to minimize the flow of dispensed protective material 106 after it is dispensed to assure the bulk of the material remains on the surface of ball bond 120, the region around the periphery of the ball bond at the surface of the aluminum pad, and on some or all of the surface of aluminum pad 104 that remains exposed outside the periphery of ball bond 120.

Figure 4:
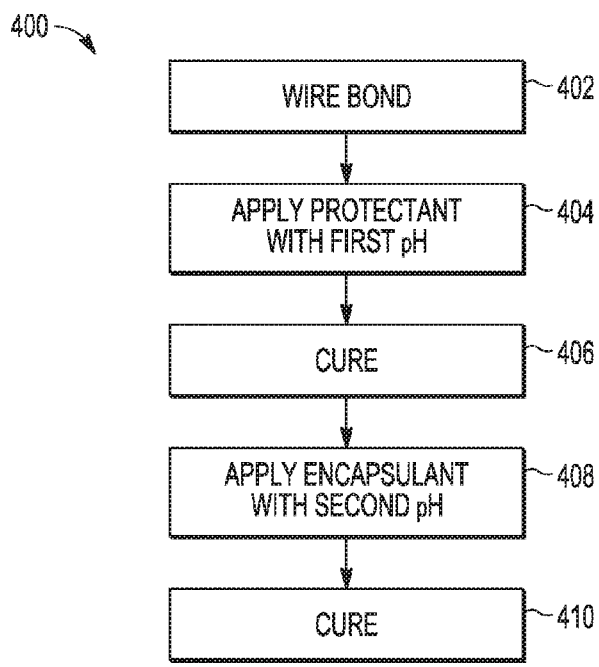
FIG. 4 is a flow diagram of an embodiment of a method for protecting wire bonds during the manufacture of a semiconductor device.

FIG. 4 is a flow diagram of an embodiment of a method 400 for protecting wire bonds during the manufacture of a semiconductor device. Process 402 includes bonding copper wire 102 to aluminum bond pad 104 using a combination of heat, pressure, and ultrasonic energy to make a weld or ball bond. One or more intermetallic layers 108, 110 are formed during the bonding process.

Process 404 includes applying protective material 106 over ball bond 120. The protective material 106 has a pH that neutralizes the acidifying effect of mobile contaminants found in the surrounding encapsulating material 103 in the presence of moisture, that may diffuse into protective material 106, thus maintaining a neutral to mildly alkaline pH in protective material 106. Maintenance of the neutral to mildly alkaline chemistry in protective material 106 prevents corrosion of intermetallic layer 108, 110, which would degrade or destroy the bond between copper wire 102 and aluminum bond pad 104, resulting in an increase in resistance or an open circuit between the ball bond 120 and aluminum pad 104. To help decrease the amount of time required to cure protective material 106, protective material 106 can be applied while semiconductor device 100, including copper wire 102, ball bond 120 and aluminum pad 104 are still hot from the bonding process. Accordingly, the dispensing of protective material 106 can be integrated into process 402 to occur on a semiconductor device 100 immediately after wire bonding on semiconductor device 100 is finished and the wire bonding had begun on the next semiconductor device 100. Alternatively, protective material 106 can be dispensed after semiconductor device 100 has been heated to the desired temperature in the dispensing operation. As a further alternative, protective material 106 can be dispensed on semiconductor device 100 and cured in an oven at the appropriate temperature. It is understood that a separate final cure operation, such as an oven cure, or irradiation with microwave energy, infrared and/or ultraviolet energy, may be required after the initial dispense process 404 and cure process 406. It is also understood that cure process 410 may also contribute to the final curing of protectant dispensed in process 404 while cure process 410 is effecting the cure of the encapsulant applied in process 408.

Dispensing protective material 106 onto a semiconductor device 100 that retains the heat of the bonding operation or has been reheated to the desired temperature may cause the dispensed protective material 106 to quickly begin to cure either by cross-linking or by evaporation of solvents and carriers. Beginning the cure immediately after dispensing protective material 106 causes the viscosity to increase before flow of the dispensed protective material 106 away from desired locations can occur. Protective material 106 may be formulated to partially or fully cure due to being dispensed onto the hot semiconductor device 100. If the protective material 106 is formulated with liquid solvents and carriers, essentially all of these materials can be volatilized before the semiconductor device 100 is encapsulated with encapsulation material 103. In some embodiments, protective material 106 does not show substantial volatilization of constituents with evolution of gases ("off-gassing") during the process of encapsulation with encapsulating material 103 or during a secondary curing operation, or post-mold cure, which is commonly required with use of a transfer molded thermoset epoxy-based encapsulant 103. If protective material 106 is only partially cured by the process of dispensing onto a heated semiconductor device 100 and will not show substantial off-gassing in subsequent processes, then the semiconductor device 100 may be encapsulated with encapsulating material 103 as long as there are no undesirable chemical reactions between partially cured protective material 106 and encapsulating material 103 during the process used to encapsulate with encapsulation material 106 or during a possible secondary cure, or post-mold cure. Under these circumstances, both protective material 106 and encapsulating material 103 will be fully cured simultaneously, which can enhance the bond between protective material 106 and encapsulating material 103.

Process 406 includes allowing the protective material 106 to cure on and about the region of the ball bond 120 in desired locations at an appropriate temperature for an amount of time that allows the materials to cure to the desired level. Process 406 may include irradiation with microwave energy, ultraviolet and/or infrared light. Process 408 includes applying encapsulating material 103 over the desired portions of semiconductor device 100. The pH established by the constituents and contaminants in encapsulating material 103 that are likely to diffuse within encapsulating material 103, and cause corrosion of intermetallic layers 108,110 during extreme environmental testing and operating conditions will be substantially neutralized by the pH of protective material 106, thereby preventing or at least reducing corrosive substances from reaching the ball bonds.

The semiconductor device 100 described herein can be made using any semiconductor material or combinations of materials, such as gallium arsenide, silicon germanium, silicon-on-insulator (SOI), silicon, monocrystalline silicon, the like, and combinations of the above.

By now it should be appreciated that there has been provided protective material 106 to be applied to copper wire ball bonds 120 so as to coat the external surface and the exposed edge of intermetallic layers 108, 110. In some embodiments, protective material 106 is formulated to be alkaline (pH >7) to neutralize acidic extractants (pH <7) formed by encapsulating materials 103. Protection from the corrosive effects of the acidic extractants allows reliable use of copper wire bonds on aluminum bond pads. Protective material 106 further allows use of any encapsulating materials 103 that meet other reliability requirements of the package, such as providing for no critical delamination, to be used. Additionally, the need to characterize candidate encapsulating materials 103, specification of new encapsulating materials 103 for use with copper wire bonded products, and the added cost of specially formulated encapsulating materials 103 is eliminated.

In some embodiments, a method for encapsulating a semiconductor device is disclosed that includes forming a plurality of wire bonds on a surface of the semiconductor device by bonding each of a plurality of copper wires onto corresponding ones of a plurality of aluminum pads. A protective material with a first pH is applied around the plurality of wire bonds. At least a portion of the semiconductor device and the protective material is encapsulated with an encapsulating material having a second pH. The first pH of the protective material neutralizes the second pH of the encapsulating material around the plurality of wire bonds.

Other aspects of the method can include curing the protective material after the step of applying the protective material. The protective material can be cured by applying thermal energy, microwave energy, ultraviolet radiation and/or infrared radiation to the semiconductor device.

In further aspects of the method, applying the protective material can include applying the protective material to the semiconductor device after the semiconductor device has been heated to a temperature between 100 and 250 degrees Celsius.

In still further aspects of the method, applying the protective material having the first pH further can comprise applying the protective material having a pH of greater than about 7.0 to the ball bonds and immediate surrounding areas of the bond pad, and encapsulating at least a portion of the semiconductor device and the protective material with an encapsulating material having a pH of less than about 7.0.

In still further aspects of the method, applying the protective material can further comprise applying the protective material comprising a suspension comprising a liquid polymer having a filler material for producing a neutral to alkaline pH in the protective material in the presence of moisture.

In further aspects of the method, the filler material can comprise one or more of magnesium hydroxide, aluminum hydroxide, calcium carbonate, magnesium carbonate, and calcium hydroxide.

In further aspects of the method, the filler material can comprise particulates having a diameter of between 0.005 to 30.0 microns (μm), and a surface area of the coarsest to the finest particles in the filler particle size distribution in a range of between 0.5 to 500 square meters per gram (m2/g), such that the surface area of the filler formed from this range of coarse to very fine particles has a surface area between these two extremes.

In further aspects of the method, the liquid polymer can have a viscosity in a range of between about 30.0 to 6000.0 milli-Pascal seconds (mPa·s) when measured at shear rates typically used in defining viscosity of dispensable filled liquid polymer systems.

In further aspects of the method, the protective material can be formed around a bond interface region between each of plurality of copper wires and the corresponding ones of the plurality of aluminum pads.

In other embodiments, a method for encapsulating a semiconductor device is disclosed that includes forming a plurality of wire bonds on a surface of the semiconductor device by bonding each of a plurality of copper wires onto corresponding ones of a plurality of aluminum pads. A protective material is applied around an interface region between each of the plurality of aluminum pads and the plurality of wire bonds. The protective material comprises a suspension comprising a liquid polymer having a filler material for producing a first pH of greater than about 7.0. At least a portion of the semiconductor device and the protective material is encapsulated with an encapsulating material having a second pH of less than about 7.0 in the presence of moisture.

In further aspects of the method, the first pH of the protective material can neutralize the second pH of the encapsulating material around the interface region between each of the plurality of aluminum pads and the plurality of wire bonds.

The method can further comprise curing the protective material using thermal energy, microwave energy, ultraviolet and/or infrared radiation after the step of applying the protective material.

In further aspects of the method, the filler material can comprise one or more of magnesium hydroxide, aluminum hydroxide, calcium carbonate, calcium hydroxide, and magnesium carbonate.

In further aspects of the method, the filler material can comprise particulates having a diameter of between 0.005 to 30.0 microns (μm), and a surface area in a range of between 0.5 to 500 square meters per gram (m2/g).

In further aspects of the method, the liquid polymer can have a viscosity in a range of between 30.0 to 6000.0 milli-Pascal seconds (mPa·s) when measured at shear rates typically used in defining viscosity of dispensable filled liquid polymer systems.

In still another embodiment, a semiconductor device includes a plurality of aluminum bond pads on a surface of the semiconductor device; a plurality of copper wire bonds, a copper wire bond of the plurality of copper wire bonds formed on each of the plurality of aluminum pads; a protective material formed around the plurality of copper wire bonds, the protective material having a first pH; and an encapsulating material applied over at least a portion of the semiconductor device and over the protective material, the encapsulating material having a second pH. The first pH of the protective material is for neutralizing the second pH of the encapsulating material around the plurality of wire bonds.

In further aspects of the semiconductor device, the protective material can comprise one or more of magnesium hydroxide, aluminum hydroxide, calcium carbonate, calcium hydroxide, and magnesium carbonate.

In still further aspects of the semiconductor device, the protective material can comprise a suspension comprising a liquid polymer having a filler material for producing the first pH of greater than about 7.0, and wherein the second pH of the encapsulating material is less than about 7.0 in the presence of moisture.

In still further aspects of the semiconductor device, the filler material can comprise particulates having a diameter of between 0.005 to 30.0 microns (μm), and a surface area in a range of between 0.5 to 500 square meters per gram (m2/g).

In still further aspects of the semiconductor device, the filler material can be in range of about 10 to 90 weight percent of the protective material.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Moreover, the pH of the protective material and the encapsulant is understood to mean the pH that would be formed within the volume of the protective material or the encapsulant when these materials are in the presence of water. It is further understood that the pH of such filled polymer systems is typically measured by subjecting powdered samples of the cured polymer systems to an extraction process using water, elevated temperatures such as approximately 85° C., and pressure in a closed system, and then measuring the pH of the aqueous extractant and calling this pH the pH of the filled polymer system.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An encapsulated semiconductor device, comprising:
 a plurality of wire bonds formed on a surface of the semiconductor device by bonding each of a plurality of copper wires onto corresponding ones of a plurality of aluminum pads;
 a protective material applied around the plurality of wire bonds, the protective material having a first pH; and
 at least a portion of the semiconductor device and the protective material encapsulated with an encapsulating material having a second pH,
 wherein the first pH of the protective material is for neutralizing the second pH of the encapsulating material around the plurality of wire bonds.

2. The semiconductor device of claim 1 wherein the protective material is a type of material that requires curing after being applied around the plurality of wire bonds.

3. The semiconductor device of claim 2, wherein the protective material is cured by at least one of the group consisting of: thermal energy, ultraviolet energy, and infrared energy to the semiconductor device.

4. The semiconductor device of claim 1, wherein the protective material has a pH of greater than about 7.0, and the encapsulating material around at least a portion of the semiconductor device and the protective material has a pH of less than about 7.0.

5. The semiconductor device of claim 1, wherein the protective material comprises a suspension comprising a polymer having a filler material for producing a neutral to alkaline pH.

6. The semiconductor device of claim 5, wherein the filler material comprises one or more of magnesium hydroxide, aluminum hydroxide, calcium carbonate, magnesium carbonate, and calcium hydroxide.

7. The semiconductor device of claim 5, wherein the filler material comprises particulates having a diameter of between 0.005 to 30.0 microns (μm), and a surface area in a range of between 0.5 to 500 square meters per gram ($m^2/g$).

8. The semiconductor device of claim 1, wherein the protective material is formed around a bond interface region between each of plurality of copper wires and the corresponding ones of the plurality of aluminum pads.

9. An encapsulated semiconductor device, comprising:
a plurality of wire bonds on a surface of the semiconductor device, each of a plurality of copper wires are bonded onto corresponding ones of a plurality of aluminum pads;
a protective material applied around an interface region between each of the plurality of aluminum pads and the plurality of wire bonds, the protective material comprising a suspension comprising a liquid polymer having a filler material for producing a first pH of greater than about 7.0; and
encapsulating material around at least a portion of the semiconductor device and the protective material, wherein the encapsulating material has a second pH of less than about 7.0,
wherein the first pH of the protective material neutralizes the second pH of the encapsulating material around the interface region between each of the plurality of aluminum pads and the plurality of wire bonds.

10. The semiconductor device of claim 9 wherein the protective material is a type of material that requires curing using at least one of the group consisting of: thermal energy, ultraviolet energy, and infrared energy.

11. The semiconductor device of claim 9, wherein the filler material comprises one or more of magnesium hydroxide, aluminum hydroxide, calcium carbonate, calcium hydroxide, and magnesium carbonate.

12. The semiconductor device of claim 9, wherein the filler material comprises particulates having a diameter of between 0.005 to 30.0 microns (μm), and a surface area in a range of between 0.5 to 500 square meters per gram ($m^2/g$).

13. A semiconductor device comprising:
a plurality of aluminum bond pads on a surface of the semiconductor device;
a plurality of copper wire bonds, a copper wire bond of the plurality of copper wire bonds formed on each of the plurality of aluminum pads;
a protective material applied around the plurality of copper wire bonds, the protective material having a first pH; and
encapsulating material around at least a portion of the semiconductor device and over the protective material, the encapsulating material having a second pH,
wherein the first pH of the protective material neutralizes the second pH of the encapsulating material around the plurality of wire bonds.

14. The semiconductor device of claim 13, wherein the protective material comprises one or more of magnesium hydroxide, aluminum hydroxide, calcium carbonate, calcium hydroxide, and magnesium carbonate.

15. The semiconductor device of claim 13, wherein the protective material comprises a suspension comprising a liquid polymer having a filler material for producing the first pH of greater than about 7.0, and wherein the second pH of the encapsulating material is less than about 7.0.

16. The semiconductor device of claim 13, wherein the filler material comprises particulates having a diameter of between 0.005 to 30.0 microns (μm), and a surface area in a range of between 0.5 to 500 square meters per gram ($m^2/g$).

17. The semiconductor device of claim 13, wherein the filler material is in range of about 10 to 90 weight percent of the protective material and the protective material has a thickness ranging between 0.005 millimeters (mm) and 0.250 mm.

* * * * *